(12) United States Patent
Ndip et al.

(10) Patent No.: US 11,328,987 B2
(45) Date of Patent: May 10, 2022

(54) WAVER-LEVEL PACKAGING BASED MODULE AND METHOD FOR PRODUCING THE SAME

(71) Applicant: Fraunhofer-Gesellschaft zur Foerderung der angewandten Forschung e.V., Munich (DE)

(72) Inventors: Ivan Ndip, Berlin (DE); Tanja Braun, Berlin (DE); Klaus-Dieter Lang, Berlin (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/696,644

(22) Filed: Nov. 26, 2019

(65) Prior Publication Data

US 2020/0176376 A1 Jun. 4, 2020

(30) Foreign Application Priority Data

Nov. 30, 2018 (DE) .......................... 102018220712.7

(51) Int. Cl.
*H01L 23/522* (2006.01)
*H01L 23/66* (2006.01)
(Continued)

(52) U.S. Cl.
CPC ...... *H01L 23/5225* (2013.01); *H01L 23/5227* (2013.01); *H01L 23/66* (2013.01); *H01L 24/32* (2013.01); *H01L 24/48* (2013.01); *H01Q 1/2283* (2013.01); *H01Q 1/521* (2013.01); H01L 2223/6677 (2013.01); H01L 2224/73265 (2013.01); H01L 2924/15311 (2013.01)

(58) Field of Classification Search
CPC ......... H01L 23/5389; H01L 2223/6677; H01L 2224/214; H01Q 1/38
See application file for complete search history.

(56) References Cited

U.S. PATENT DOCUMENTS

2008/0029886 A1\* 2/2008 Cotte ...................... H01L 24/24
257/728
2009/0168367 A1 7/2009 Fujii
(Continued)

FOREIGN PATENT DOCUMENTS

| DE | 102017200122 A1 | 7/2018 |
| DE | 102017200124 A1 | 7/2018 |
| DE | 102017200127 A1 | 7/2018 |

*Primary Examiner* — Dale E Page
*Assistant Examiner* — Wilner Jean Baptiste
(74) *Attorney, Agent, or Firm* — Perkins Coie LLP; Michael A. Glenn

(57) ABSTRACT

A wafer-level packaging based module includes an antenna board and a chip board. The antenna board includes at least one antenna layer with introduced antenna element and a shielding layer with introduced shielding element in the area of the at least one antenna element opposite to the antenna layer. The chip board includes a contacting layer, a rewiring layer opposite to the contacting layer and the shielding layer having at least one shielding element arranged on the rewiring layer. A chip layer having at least one chip is arranged between the contacting layer and the rewiring layer. Further, the chip layer includes at least one via connecting the contacting layer to the rewiring layer.

15 Claims, 12 Drawing Sheets

(51) Int. Cl.
*H01Q 1/22* (2006.01)
*H01L 23/00* (2006.01)
*H01Q 1/52* (2006.01)

(56) References Cited

U.S. PATENT DOCUMENTS

| | | | |
|---|---|---|---|
| 2010/0103634 A1* | 4/2010 | Funaya | H05K 1/185 |
| | | | 361/761 |
| 2013/0292808 A1* | 11/2013 | Yen | H01L 23/5227 |
| | | | 257/660 |
| 2018/0191053 A1 | 7/2018 | Ndip et al. | |
| 2018/0191062 A1 | 7/2018 | Ndip et al. | |

* cited by examiner

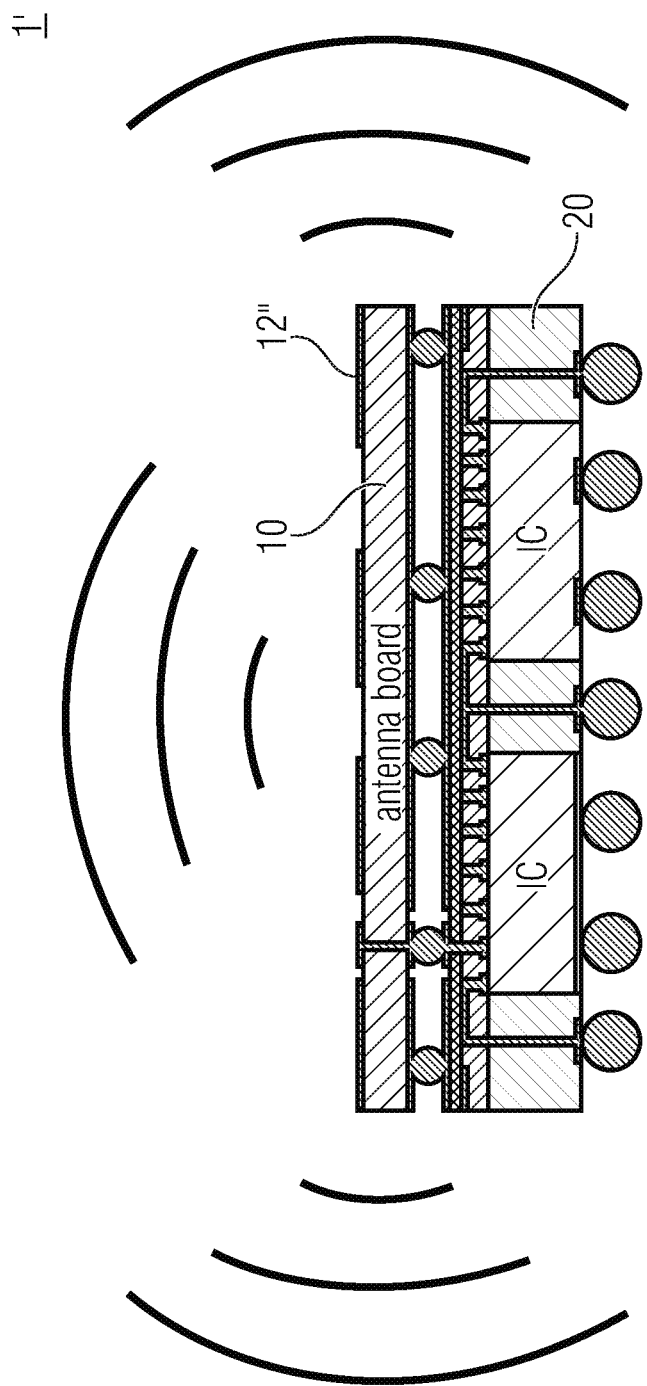

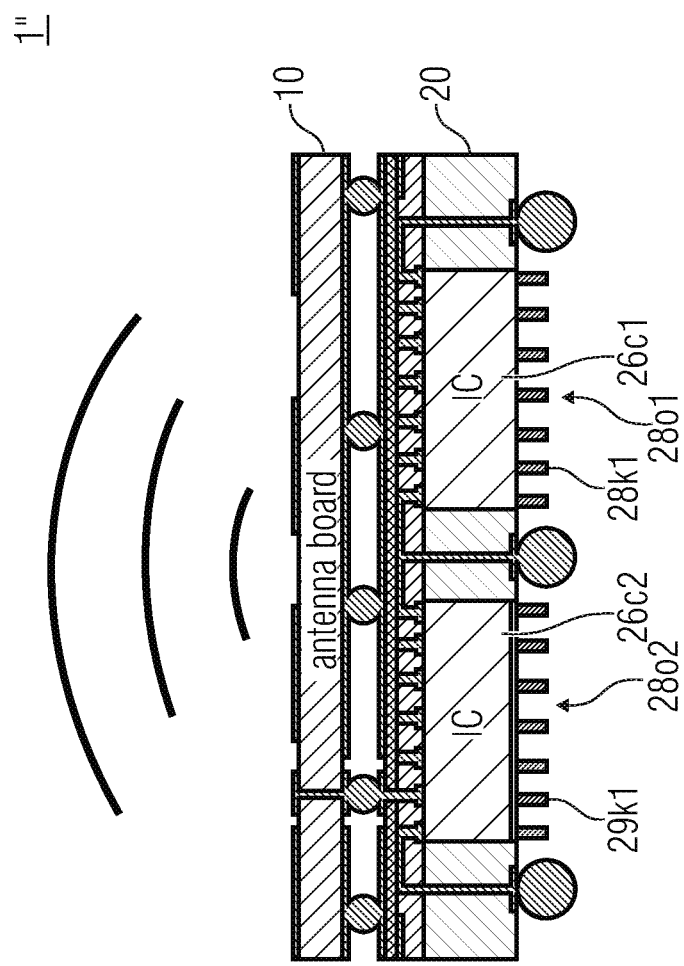

WAVER-LEVEL PACKAGING BASED MODULE AND METHOD FOR PRODUCING THE SAME

CROSS-REFERENCE TO RELATED APPLICATIONS

This application claims priority from German Patent Application No. 102018220712.7, which was filed on Nov. 30, 2018, and is incorporated herein in its entirety by reference.

Embodiments of the present invention relate to a wafer-level packaging based module having an antenna board as well as a chip board. Embodiments relate to a fan-out panel/wafer-level packaging based module having an antenna board as well as a chip board. Further embodiments relate to a respective production method.

BACKGROUND OF THE INVENTION

Wireless systems (e.g., wireless communication systems for consumer applications or radar sensors for industrial and automobile applications) play an important role in our everyday life and economics. For allowing the spreading of future wireless systems, the same have to be miniaturized and cost-effective. Miniaturization allows that future wireless systems can be integrated in many other systems in our environment and thereby provide many new applications that are not yet conceivable.

Packaging platforms play an important role for realizing wireless systems since the same allow the integration of the important system components, such as chips, passive components and antennas. Wafer-level packaging, in particular fan-out wafer/panel level packaging have many advantages over conventional packaging concepts, they allow, e.g., the realization of miniaturized wireless systems for communication and radar sensor applications. Above that, the same also allow short links between the integrated components for allowing signal and power integrity. Therefore, the same are already used today for realizing smart phones and tablets as well as for producing automobile radar sensors. The same will also be used for realizing future wireless systems.

For increasing the performance of future wireless communication systems and radar sensors, more channel bandwidth is needed. The bandwidth needed for realizing such systems is only available for higher frequencies (especially at millimeter waves and terahertz frequencies). However, free-space attenuation is extremely high at such frequencies. Thereby, the range of such systems is very limited (only several meters) and their applicability very limited. For solving that problem, efficient and high-gain integrated antennas as well as several power-amplifier chips have to be used for realizing future wireless systems. Thereby, modular systems consisting of a specific number of antennas and front end chips can be built that are arbitrarily interconnected for obtaining a desired range. However, the integrated antennas generate stray fields which can result in electromagnetic compatibility problems (EMC problems) and negatively influence the functionality of the integrated chips and other passive components. The power amplifiers generate a lot of heat which has to be dissipated from the chips in order to prevent thermomechanical problems. This means the design of future more powerful miniaturized and cost effective wireless systems presents many challenges for wafer-level packaging. The wafer-level packaging based module for the realization of future wireless systems has to fulfil simultaneously at least the following requirements:

a) Fulfilling modular and heterogeneous system integration with higher production flexibility, i.e. the antenna elements can be produced on a separate board consisting of a technology allowing optimization of the antenna efficiency. With the help of wafer-level packaging processes, the front-end chips and needed passive components can be integrated in a separate board allowing optimized integration of the chips and the passive components. The two boards are connected to allow modular functionality. Thereby, the entire system performance is optimized since the individual boards are optimized.

b) Shielding of the antenna stray fields from the chips and passive components to prevent EMC problems.

c) Dissipating heat from the chips in order to prevent thermomechanical reliability problems.

d) Reducing the production costs.

The most frequently used wafer-level packaging based modules are eWLB and InFO. However, the same cannot fulfil all the above-stated requirements. For example, the antennas in eWLB and InFO cannot be optimized without adapting the dimensions of the rewiring layer and the substrate of the chip which limits the freedom of design of the two packaging modules. Both in eWLB as well as InFO, the fields of the integrated antennas are not sufficiently well shielded from the chips and other integrated components. The undesired interaction can result in EMC problems.

SUMMARY

According to an embodiment, a wafer-level packaging based module may have: an antenna board including at least one antenna element introduced into an antenna layer and a shielding element introduced in an opposite shielding layer in the area of the at least one antenna element; a chip board including a contacting layer, a rewiring layer opposite to the contacting layer, a shielding layer including at least one shielding element arranged on the rewiring layer and a chip layer including at least one chip lying between the contacting layer and the rewiring layer, wherein the chip layer includes at least one via connecting the contacting layer to the rewiring layer; wherein the chip board and/or the contacting layer includes an opening for contacting contact elements or a cooling body in the lateral area of the chip on the side of the contacting layer; wherein the antenna board is connected to the chip board by means of electrically conductive connecting elements on the side of the rewiring layer of the chip board.

According to another embodiment, a method for producing an inventive wafer-level packaging based module may have the steps of: producing a chip board; producing an antenna board; connecting the antenna board to the chip board on the side of the rewiring layer of the chip board by means of electrically conductive connecting elements.

The embodiments of the present invention provide a fan-out panel/wafer-level based module with an antenna board/antenna substrate as well as a chip board/chip substrate. The antenna board includes at least one shielding element introduced into an antenna layer, e.g., the top layer (introduced antenna element) as well as a shielding element introduced in an opposite shielding layer. From a lateral perspective, the same is arranged at least in the area of the antenna element. The antenna board can also consist of a multilayer substrate. The chip board includes a contacting layer and a wiring layer opposing the contacting layer. Further, a shielding layer having at least one shielding element is arranged on the rewiring layer. Obviously, a chip layer having at least one passive element, such as a filter, L, C or R member is provided between the contacting layer and the rewiring layer. Further, the chip board or the chip layer comprises at least one via by which the contacting layer and the rewiring layer are connected to one another. Further, the chip layer and/or the contacting layer are opened in the lateral area of the chip on sides of the contacting layer. Via this opening, contacting of contacting elements or a cooling body can take place.

Embodiments of the present invention are based on the knowledge that by using two boards/substrates (antenna board and chip board) to be connected to one another good producibility can be obtained. Since the rewiring layer is provided on the side of the antenna board, the opposing contacting layer can be configured such that openings can be provided in the area of the chips for contacting, in particular of heat dissipating elements (cooling bodies). Further, providing a shielding layer or shielding elements on the rewiring layer as well as on the opposing surface of the antenna board enables interferences of the chips by the antenna to be prevented.

According to embodiments, the antenna board comprises at least one via or a transmission channel projecting through the antenna board and the shielding layer of the antenna board and thus allows that electric coupling of the antenna element can take place from outside or in particular from the rewiring layer of the chip board. This type of coupling is also called probe feed. The antenna elements can also be excited by electromagnetic coupling (proximity feed or aperture couple feed). For this, according to embodiments, the chip board comprises a contact element or a transmission channel in the rewiring layer which projects through the shielding layer and is electrically coupled to the chip. For example, the transmission channel can be formed in the area of the chip through an opening of the rewiring layer as well as the shielding layer, such that electromagnetic coupling out is enabled. Alternatively, it would be possible that a conductive path is provided in the rewiring layer projecting up to the surface of the chip board. According to an embodiment, the via of the antenna board is connected to the contact element of the chip board by means of a connecting element. Alternatively, the transmission channel of the antenna board can be coupled to the transmission channel of the chip board by means of a connecting channel, e.g., by pure alignment. According to embodiments, a significance of the transmission line allowing optimum coupling is formed through via, connecting element and via or transmission channel, connecting channel and transmission channel. From a lateral view, positioning of the listed elements in the area of the chip would be advantageous.

According to embodiments, the two shielding layers or the shielding elements of the shielding layers are coupled to one another in the boards, antenna and chip, e.g., by means of a connecting element. According to embodiments, the shielding elements/shielding layers are not only coupled to one another but also to ground.

The electric connection between the shielding layers or also between the vias for coupling the antenna signals can take place, for example via solder balls or so-called BGA balls. The same are inexpensive to produce and allow simple connection of antenna board and chip board both in electrical as well as in mechanical terms. Further, by such connecting elements it is also possible that a cavity is formed between the two shielding layers of antenna board and chip board, which further contributes to shielding the electromagnetic radiation caused by the antenna elements. Regarding the optimization of the radiation characteristics, it should be noted that the antenna board can comprise a perforation, for example in the area of the antenna elements. Depending on the exact configuration of the one or several antenna elements, the electromagnetic radiation can either be radiated towards the top or also laterally (to the top means in the direction of the chip board) or simultaneously to the top and laterally.

Regarding the contacting of the entire modules, it should be noted here that the same takes place via the contacting layer. According to embodiments, the module can comprise, for example, solder balls or BGA balls for this. These solder balls or BGA balls can also be provided in the area of the chip, i.e., in detail in the area of the above-discussed opening, such that the chip can be electrically contacted directly from outside and electrical contacting does not necessarily have to take place via the provided via as well as rewiring layer and contacting layer. According to further embodiments, however, a cooling body or general means for heat dissipation can be provided in the area of the opening. Means for heat dissipation can also include simple BGA balls or solder balls since the same provide a large surface. According to further embodiments, a combination of the functionality of electric contacting and heat dissipation for BGA balls or solder balls in the area of the opening would also be possible.

A further embodiment provides a method for producing the above-discussed module. The method includes the central step of connecting the antenna board to the chip board on the side of the rewiring layer by means of electrically conductive connecting elements.

BRIEF DESCRIPTION OF THE DRAWINGS

Embodiments of the present invention will be detailed subsequently referring to the appended drawings, in which:

FIG. 2a-2c are schematic illustrations of a wafer-level packaging based module according to extended embodiments;

FIG. 3a, 3b are schematic illustrations of a wafer-level packaging based module according to other extended embodiments;

DETAILED DESCRIPTION OF THE INVENTION

Before embodiments of the present invention will be discussed below with reference to the accompanying drawings, it should be noted that equal elements and structures are provided with the same reference numbers, such that the description of the same is inter-applicable or inter-exchangeable.

Figure 1:
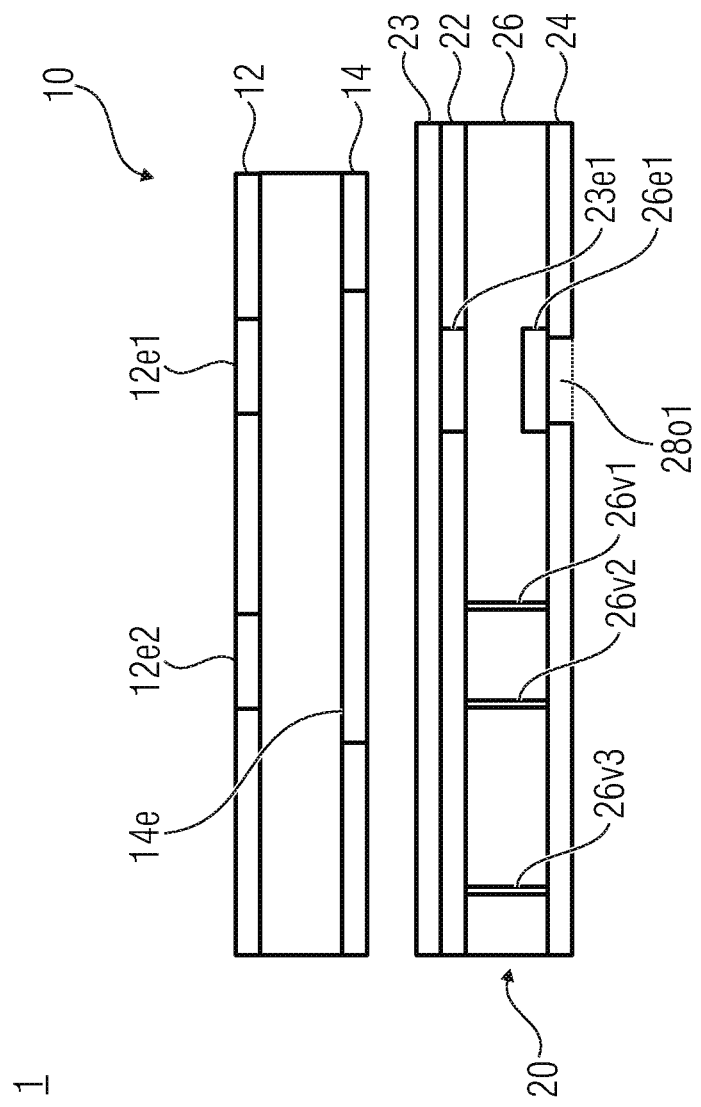
FIG. 1 is a schematic illustration of a wafer-level packing based module with chip and antenna board according to a basic embodiment.

FIG. 1 shows a wafer-level packaging based module 1 comprising an antenna board 10 and a chip board 20. The chip board and the antenna board are connected to each other, for example by means of solder balls or other connecting elements, which allow arranging of two processed substrate/boards as stacks on top of one another. The connecting means are provided with reference number 30 and generally allow mechanical and electrical connection.

The antenna board 10 includes an antenna layer 12 comprising at least one antenna element 12e1. Further, an optional second antenna element 12e2 is illustrated. As can be seen, the antenna element 12 is arranged or deposited on the main surface of the antenna board 10 facing toward the outside, i.e., facing away from the chip board 12. This is illustrated only exemplarily in this embodiment, such that it should be noted here that the antenna layer 12 can also be arranged within the layer stack forming the antenna board 10. In this embodiment, a shielding layer 14 is provided on the side opposing the antenna layer 12, i.e., on the second main surface of the antenna board 10. The same is arranged on the second main surface opposite to the main surface of the antenna layer 13, wherein it should again be noted that the arrangement on the main surface is advantageous but not mandatory, such that the shielding layer 14 can also be arranged within the layer stack forming the antenna board 10. The shielding layer 14 includes a shielding element (or several shielding elements) which, in this embodiment, is arranged laterally in the area of the antenna elements 12e1 and 12e2. Since the shielding layer 14 serves to keep electromagnetic radiation emitted by the one or several shielding elements 12e1 and 12e2 away from the chip layer, the shielding layer 14 is arranged between the antenna layer 12 and the chip board 20.

The chip board 20 comprises a contacting layer 24 as well as a rewiring layer 22. The rewiring layer 22 is provided on the side of the antenna board 10, while the contacting layer 24 is arranged on an opposing side. Both layers 22 and 24 can each also be provided on the main surface or also within the layer stack forming the chip layer. A so-called chip layer 26 comprising at least one chip 26c1 is provided between the rewiring layer 22 and the contacting layer 24. A via 26v1 is also provided within this chip layer which connects the rewiring layer 22 with the contacting layer 24. Obviously, as illustrated exemplarily herein, additional vias 26v2 and 26v3 can be provided which also allow connection of the layers 22 and 24.

A shielding layer 23 is also provided on the rewiring layer 22, i.e., on the side facing the antenna board 10. This shielding layer again includes at least one shielding element 23e1 which is provided with respect to the lateral positioning in the area of the chip 26c1. The same again serves to shield the chip 26c1 from electromagnetic radiation, e.g., emitted by antenna elements 12e1, 12e2.

On the opposing side, i.e., on the main area of the chip board 20 facing away from the antenna board 10, the contacting layer 24 or the contacting layer 24 as well as the chip layer 26 is opened in the area of the chip 26c (cf. reference number 2801). This opening serves to either directly contact the chip 26c and/or to provide a cooling body or generally cooling means within this area for improving the heat dissipation of the chip 26c1.

As already indicated, according to embodiments, the chip layer 26 can include several chips 26c1, such that then several openings 2801 etc., and several shielding elements 23e1 etc., are provided.

According to embodiments, the connection 30 of the two boards 10 and 20 is implemented, for example by solder balls or the same. By means of these solder balls, for example, a signal line starting from the chip 26c1 via the rewiring layer 22 is established to one or several antenna elements 12e1 and 12e2. Here, the shielding layers 14 and 23 or the associated shielding elements 14e and 23e1 are typically electrically connected to one another via such solder balls.

These shielding layers are typically connected to ground. Using solder balls results in a gap between the boards 10 and 20.

The embodiment of the wafer-level packaging based module 1 illustrated herein provides the following advantages.

Optimizing the System Performance by Heterogeneous Integration: the antenna elements are realized on the antenna board. The chips are integrated in the chip layer and the passive components, for example the inductances, can be realized in the rewiring layer. This means all these important components can be optimized individually without influencing the performance of the other components, since the module 1 offers the option of different technologies for production or the integration of the individual components. This means a suitable substrate technology can be selected for producing and optimizing the antennas, without influencing the integration of the chip or the production/integration of the passive components. For integrating the chip, a different substrate technology that is more suitable for chip integration can be selected without influencing the characteristics of the antennas or passive components. Further, for integrating and optimizing the inductances, a suitable technology of the rewiring layer can be selected without influencing the antenna characteristics or the integration of the chip. Thereby, the entire system performance can be optimized by the specific optimization of the individual components. This feature of the wafer-level packaging based module 1 is significantly different to most existing modules of conventional technology.

Reduction of Production Costs: For realizing the antenna board, low-cost printed circuit board materials can be used. This results in a significant reduction of the production costs. Further, the module 1 is realized by panel-level packaging. Thereby, several thousands of the modules can be produced simultaneously. This also reduces the production costs.

Miniaturization: For realizing the wafer-level packaging based module 1, no additional interposer substrate for chip assembly is needed, as is the case, for example, in flipchip packaging or wirebond packaging. By eliminating the additional interposer substrate, the height of the module can be significantly reduced. This does not only result in the miniaturization of the system but also in the reduction of the production costs.

EMC of the System: By using two shielding layers 14 and 22 with associated shielding elements 14e and 23e1 in combination with the optional cavity in the connecting plane 30, good electromagnetic decoupling of the chip 26c1 from the radiating antenna elements 12e1 and 12e2 is obtained. Thereby, the stray fields of the antennas are shielded from the integrated chip and passive components. This results in EMC of the system.

Thermomechanical Reliability: By arranging the rewiring layer 22 on the top, a slightly simpler contacting layer 24 can be provided on the rear, which allows the provision of openings 2801 in the area of the chip for direct connection and heat decoupling. This results in dissipation of heat from the chip and hence to thermomechanical reliability of the system.

Signal Integrity: The connections between the integrated chips and between the chips and the antennas are very short with few geometrical discontinuities. This results in chip-to-chip and chip-to-antenna signal integrity.

This increases the antenna gain since the reflections along the path between chip and antennas are heavily reduced.

Power Integrity: Capacitors provided for the stability of the voltage supply system can be directly integrated in the chip layer beside the chips in the fan-out area. Due to the short paths between such capacitors and the chips, the parasitic inductance of the paths becomes very small. Thereby, power integrity problems such as simultaneous switching noise (SSN) will be minimized.

Figure 2A:
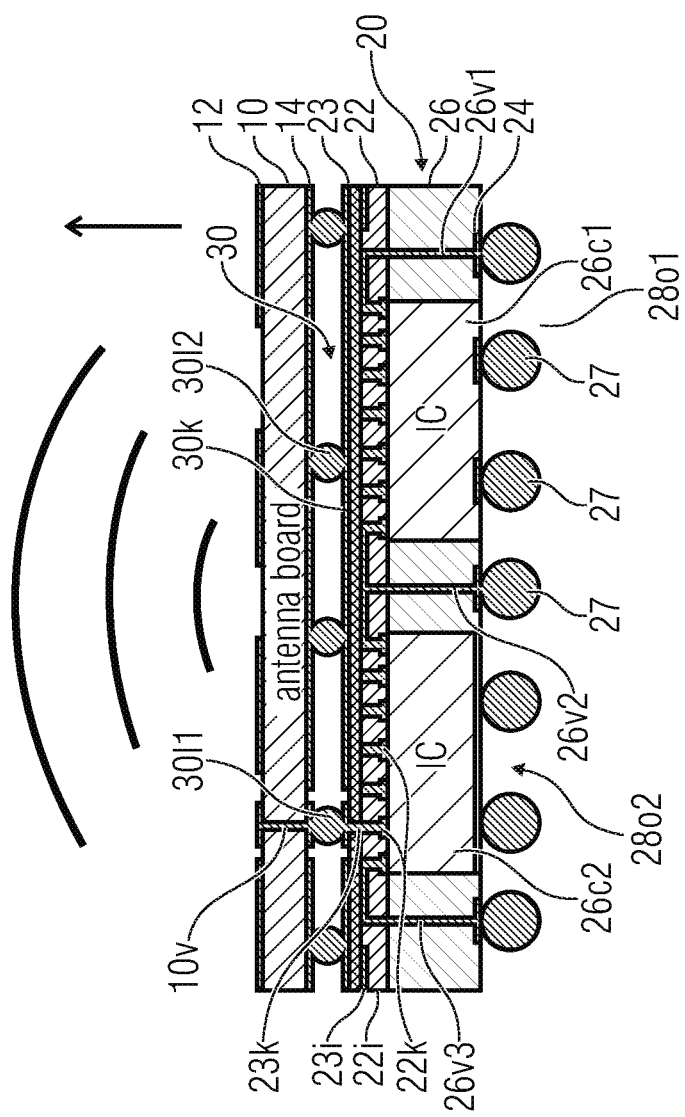
Figure 2B:
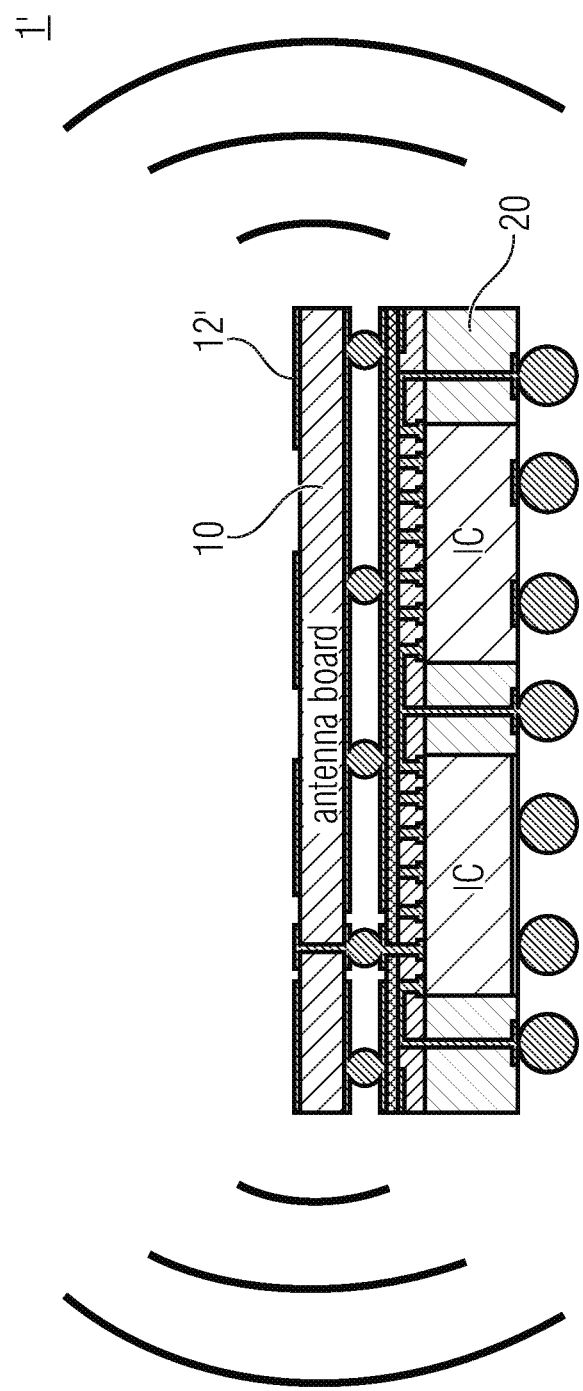

With reference to FIGS. 2a and 2b, extended embodiments will be discussed.

FIG. 2a shows a wafer-level packaging based module 1' having the antenna board 10 as well as the chip board 20.

The antenna board 10 again comprises the antenna layer 12 as well as the shielding layer 14. The chip board 20 again includes the layers chip layer 26 between the rewiring layer 22 and the contacting layer 24 as well as the shielding layer 23. In this embodiment, the shielding layer 23 is separated from the rewiring layer 22 by a nonconductive intermediate layer. The same has the reference number 23i and is part of the shielding layer 23. In this embodiment, several chips 26c1 and 26c2 are provided in the chip layer 26. Apart from the chips 26c1 and 26c2 or between the chips 26c1 and 26c2, a plurality of vias 26v1 to 26v3 is arranged, which connect the rewiring layer 22 with the contacting layer 24. A plurality of BGA balls or solder balls (generally electrical connecting elements) is provided in the area of the vias 26v1 to 26v3 as well as in the area of the chips 26c1 and 26c2. The same are provided with the reference number 26. For allowing direct contact of the solder balls 27 to the ICs 26c1 and 26c2, the opening 2801 is provided in the area of the chip 26c1 and 2802 in the area of the chip 26c2. The BGA balls 27 have, on the one hand, the purpose of electric contacting. Above that, in particular the BGA balls 27 in the area of the chip 26c1 and 26c2, still have the double function of dissipating waste heat of the chips 26c1 and 26c2.

According to embodiments, it should be noted with respect to the rewiring layer that the same also can consist, for example, of several layers. For example, in FIG. 2a, the same consists of an insulating layer 22i as well as a layer with conductive traces 22. The conductive traces of the conductive layer 22 are connected to the chips 26c1 and 26c2 via individual contacts 22k, such that an electric contact is established by the insulator 22i.

Regarding the antenna board 10, it should be noted that, according to embodiments, the same can also include vias 10v via which the antenna elements of the antenna 12 are coupled. This via 10v projects, for example, also through the shielding layer 14 and can be coupled from outside via the solder balls 30/1 or similar connecting means.

According to embodiments, the two boards 10 and 20 are connected to one another in the area 30. This area 30 is formed by solder balls 30/1 and 30/2, wherein the solder ball 30/1 serves for signal transmission, i.e., for coupling the antenna 12 while the solder balls 30/2 are used for coupling the shielding layer 14 to ground starting from the shielding layer 23. Cavities that are provided, for example, with reference number 30k are provided between the solder balls.

Regarding the coupling of the antenna 12 by the via 10v as well as the contact 30/1 it should be noted that both the shielding layer 14 as well as the shielding layer 23 is open for the contact 30/1. As can be seen, coupling of the contact 30/1 to the IC 26c2 takes place directly via an additional connecting element 23k projecting through the rewiring layer 22 as well as the shielding layer 23 and the respective insulation layers 22i and 23i. According to embodiments, via 10v, contact 30/1 as well as contact 23 form a vertical line to influence the signal as little as possible. In the area of the contact 23k, the shielding elements of the shielding layers 23 and 14 each have an opening, wherein this opening can also be realized in that some sort of pad is formed insulated from the rest of the shielding layer via which the contacting can take place by means of the solder ball 30/1.

Regarding the shielding layer 23 of the chip board 20, it should be noted that the same can be used both for shielding the ICs 26c1 and 26c2 as well as for shielding other components (for example passive components, such as inductances, capacitors, filters or R members) embedded into the chip layer 26. Such a shielding is particularly efficient since when only one shielding layer, such as the shielding layer 14 is assumed, the antenna return current is guided directly to a layer above the chip which can result in electromagnetic problems. These problems exist in particular since the rewiring layer would form a quasi-parallel wave guide which amplifies the EMC effects further. By providing the second shielding layer 23, such effects are reduced and minimized.

Regarding the design of the vertical signal line including elements 10v, 23k and 30/1 it should be noted that here the shortest possible geometrical path is obtained which has the effect that only minimum discontinuities occur. This has a particularly positive effect on the HF characteristics of the module 1'. Compared to conventional solutions, this positive effect becomes more significant since in conventional solutions the signal line is typically first guided in parallel via the rewiring layer whereby reflections due to non-matching impedances can occur. This influence of reflections is minimized by very short connections to the antenna elements with little geometrical discontinuities. As a result, a very good antenna gain of the antenna elements 12e1 and 12e2 of the antenna layer results.

Regarding the contacting layer 24 and the solder balls 27 intended for contacting it should be noted that typically both the signal from outside and the voltage supply as well as control signals are applied via these contacts. This results in a significantly higher freedom in signal guidance such that influences of high-frequency signals by power signals or vice versa can mostly be prevented.

After having discussed the structure, its implementations and advantages in detail, it should be noted that the antenna board 10 illustrated herein and in particular the antenna layer 12 is configured such that vertical radiation (essentially perpendicular to the laterally extending main surface of the antenna board 10) results.

Concerning the material selection, it should be noted that the chip board 20 is formed of a polymer using fan-out wafer-level packaging processes, while the antenna board 10 can be formed of practically any packaging material. According to embodiments, the board of the antenna element 10 is, for example, periodically perforated such that a filter for the surface waves is formed. Such a perforation helps to reduce the effective permeability.

FIG. 2b shows a wafer-level packaging based module 1' essentially unamended with respect to the structure. A significant difference is, however, within the antenna layer 12' which is formed essentially for lateral radiation of the electromagnetic wave, i.e., for radiating in the longitudinal direction of the module 1'. This is obtained by the design of the antenna elements.

FIG. 2c again shows the same structure 1', wherein here the antenna layer 12" is configured both for lateral as well as vertical radiation.

Figure 3A:
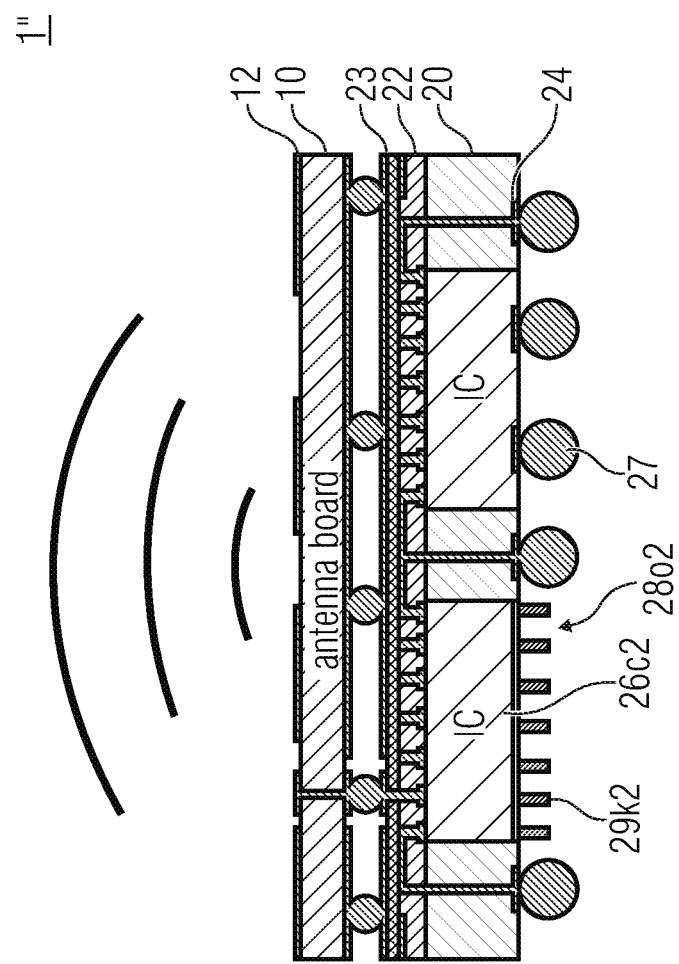

As discussed above, the opening 2801 can be used both for electric contacting as well as heat dissipation. Heat dissipation can take place via the BGA balls as in embodiments 2a to 2c. Alternatively, as shown in FIGS. 3a and 3b, cooling bodies can be used. Both variations allow that a large part of the rear of the chip can be used for heat dissipation.

With reference to FIGS. 3a and 3b, a modified wafer-level packaging based module 1' will be discussed. This module again includes an antenna board 10 as well as a chip board 20. The antenna board 10 essentially corresponds to the antenna board 10 of module 1', wherein here again the different variations of the antenna layer 12, 12' or 12" can be used. The chip board 20 essentially corresponds to the chip board 20 of module 1', wherein here a cooling body 29k2 is provided in the area of the opening 2802 of the chip 26c2. The same is provided in the area of the chip 26c2 and configured to dissipate waste heat of the chip 26c2. As can be seen here, according to embodiments, the cooling body 29k2 is smaller than the height of the solder balls (connecting elements) 27 with respect to its height extension (analogous to the layer thickness). Thus, the entire module 1" can be deposited on a base, such as a system PCB board without any specific preparations. Alternatively, larger cooling bodies can be used. In such cases, different methods can be used to integrate the cooling body. For example, the cooling body can be attached to the chips by specific means (e.g., conductive adhesive). For mounting the module, recesses will be generated in the system PCB board for integrating the cooling body. It is also possible that first a large metal block is attached to the chip. Then, the module is mounted to a system PCB board also including a metal core. The cooling body is then attached to the rear of the system PCB board.

Regarding the residual optional and non-optional features, the chip board 20 essentially corresponds to the chip board 20 of the module 1' (cf. contacting layer 24, rewiring layer 22 or shielding layer 23).

FIG. 3b shows a further variation of the wafer-level packaging based module 1". Here, the cooling body 29k2 is provided in the area of the opening 2802 and the cooling body 28k1 in the area of the opening 2801. This cooling body 28k1 serves to cool the chip 26c1. Regarding the residual features, the antenna board 10 as well as the chip board 20 corresponds to the antenna board/chip board of module 1" of FIG. 3a.

As already discussed above, the discussed wafer-level packaging based modules 1, 1' and 1" are very easy to produce since both the chip board 20 and the antenna board 10 are easy to process by means of conventional production methods. For example, the chip board 20 is produced with fan-out wafer-level packaging processes by embedding the chips 26c1 and 26c2.

The antenna board can, for example, comprise a packaging material of base material onto which metallization layers 12 and 14 are deposited both on the front and the rear. The two substrates/boards 10 and 20 are then connected to each other by means of conventional connecting technologies, solder balls or other comparable mechanisms. This connecting of two boards 10 and 20 presents the central step.

Figure 4A:
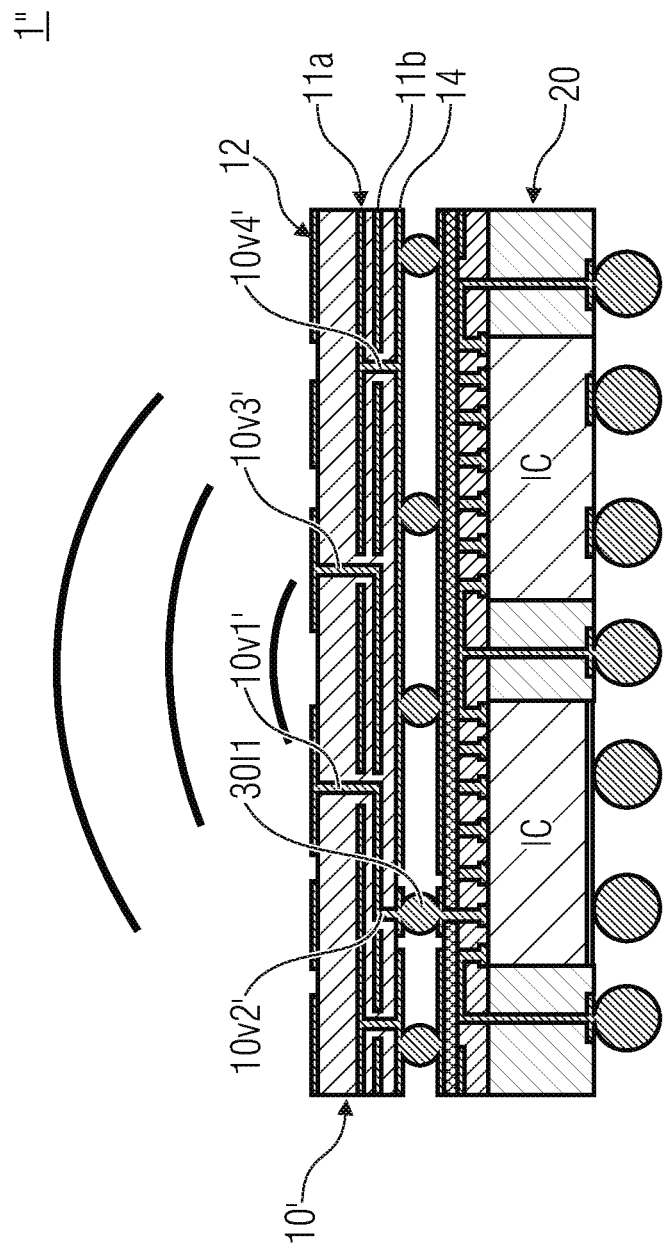
FIG. 4a-4c are schematic illustrations of wafer-level packaging based modules with an extended antenna board according to embodiments.

FIG. 4a shows a wafer-level packaging based module 1" which corresponds to the embodiment of FIG. 1a regarding the chip board 20, wherein here a modified antenna board 10' is used. The antenna board 10' includes an antenna layer 12 as well as a shielding layer 14. Two additional layers 11a and 11b are provided between the antenna layer 12 and the shielding layer 14. The metallization layer 11a is arranged closer to the antenna layer 12, while the metallization layer 11b is provided closer to the shielding layer 14. The metallization layer 11b is a so-called signal layer for distributing the antenna elements. Therefore, this layer 11b is connected to the antenna layer 12 by means of a first via 10v1' and to the contact element 30/1 by means of a further via 10v2'. As illustrated herein, several couplings of the antenna layer 12 can be provided as well (cf. via 10v2').

The layer 11a fulfils a further shielding function. Here, the signal layer 11b and the ground layer 14, respectively, are shielded additionally from the antenna layer 12. For realizing efficient shielding, the shielding layer 11a is connected to the layer 14 by means of a via 10v4'.

According to further embodiments, additional elements can be integrated in the antenna board. It would, for example, be possible that a power divider is integrated in the rewiring layer 11b or in another layer of the antenna board 10'. Obviously, further or alternative passive devices for integration into the antenna module 10' would be possible. According to further embodiments, it would also be possible that several additional metallization layers, either for rewiring or for shielding, are provided in the antenna module 10'.

Figure 4B:
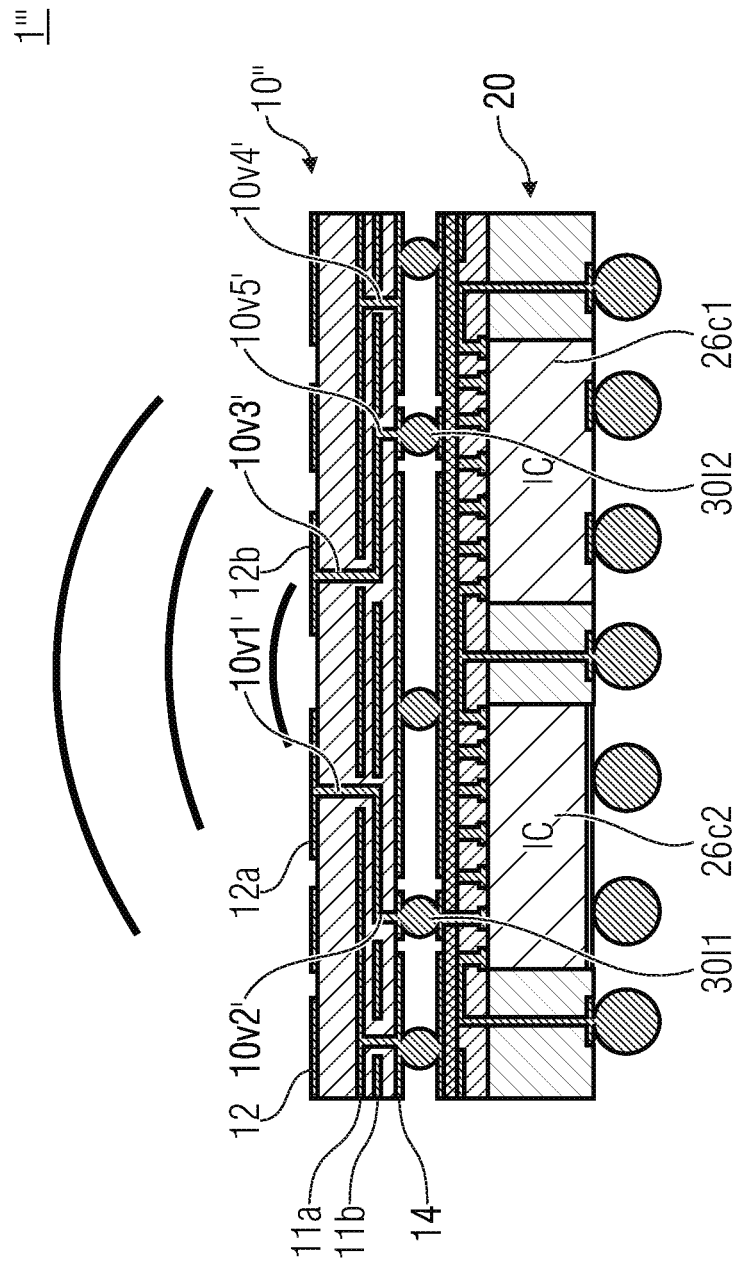

FIG. 4b shows, based on the wafer-level packaging based module 1''', further variations of the antenna module, namely the antenna module 10" in combination with the chip module 20. The antenna module 10" again includes layers 12, 11a, 11b and 14. In this embodiment, the layer 11b is provided in a slightly modified manner, since the same is now structured such that different antenna elements 12a and 12b can be excited via different connections, e.g., starting from the different chips 26c1 and 26c2.

In the present embodiment, two signal paths are provided. The first signal path extends from the chip 26c2 via the connecting element 30/1, the via 10v2', part of the rewiring layer 11b and the via 10v1' to the antenna element 12a. The second signal path extends from the chip 26c1 via the contact element 30/1, the via 10v3', the rewiring layer 11b and the via 10v5' to the antenna element 12b.

Figure 4C:
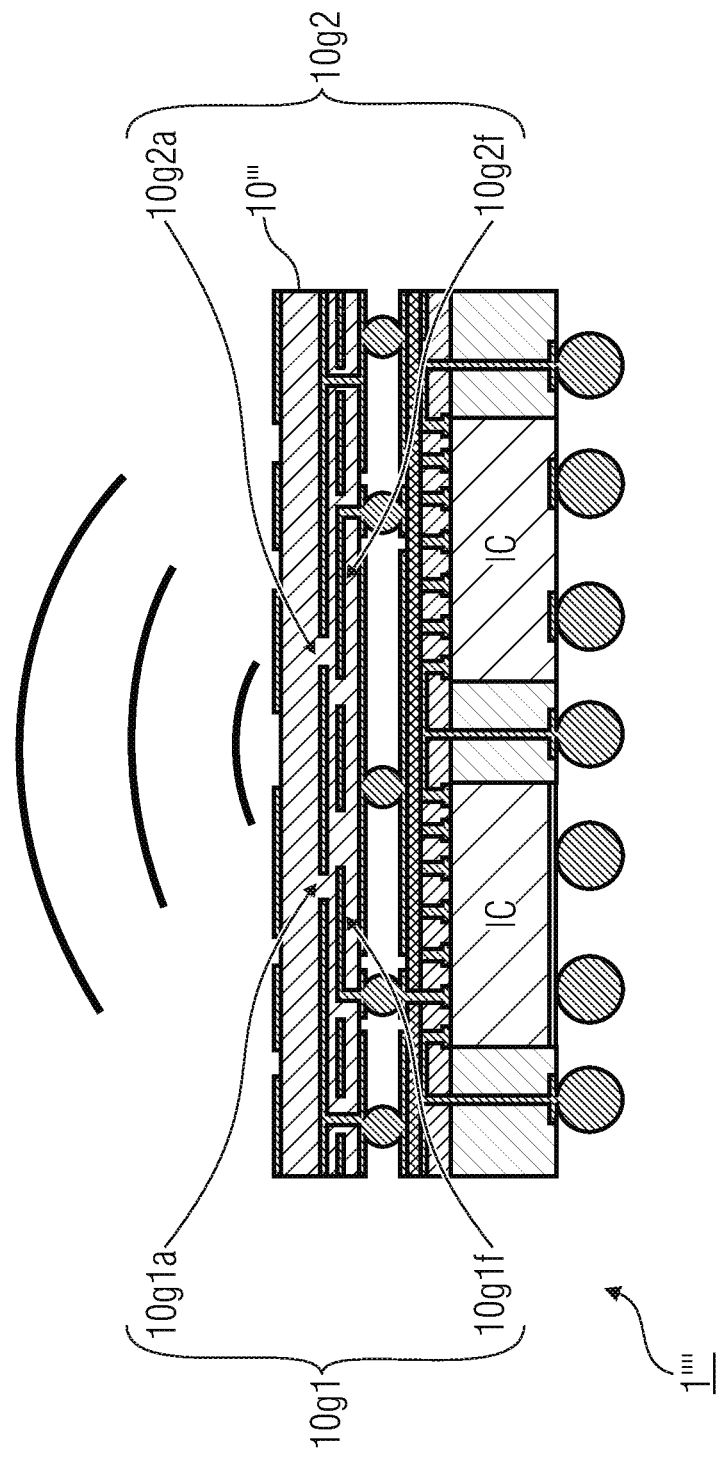

FIG. 4c shows a module 1"" antenna module 10'''. Here, the antenna module 10''' is modified with respect to the antenna module 10" of FIG. 4b such that instead of probe feed through the vias 10v1' and 10v3', aperture coupled feed is provided. These structures allowing this aperture coupled feed are marked by reference numbers 10g1 and 10g2. Every aperture feed 10g1 and 10g2 include a feed line 10g1f/10g2f and a respective aperture 10g1a/10g2a.

FIG. 5 shows the integration of a module 1"" essentially corresponding to the module 1''', wherein the antenna module 10''' of FIG. 4c is used. Above that, the wafer-level packaging module 1"" is deposited on a system board 45, namely via the solder balls 27. In this embodiment, the system board has an opening 46 below the chip 26c2 into which a temperature sink, e.g., a cooling body is introduced. This cooling body is provided with reference number 28' and projects through the system board 46. Here, it should be noted that obviously direct contacting of the chip 26c2 takes place. Here, for example, heat-conductive mounting material provided with reference number 28a' can be used.

Figure 5A:
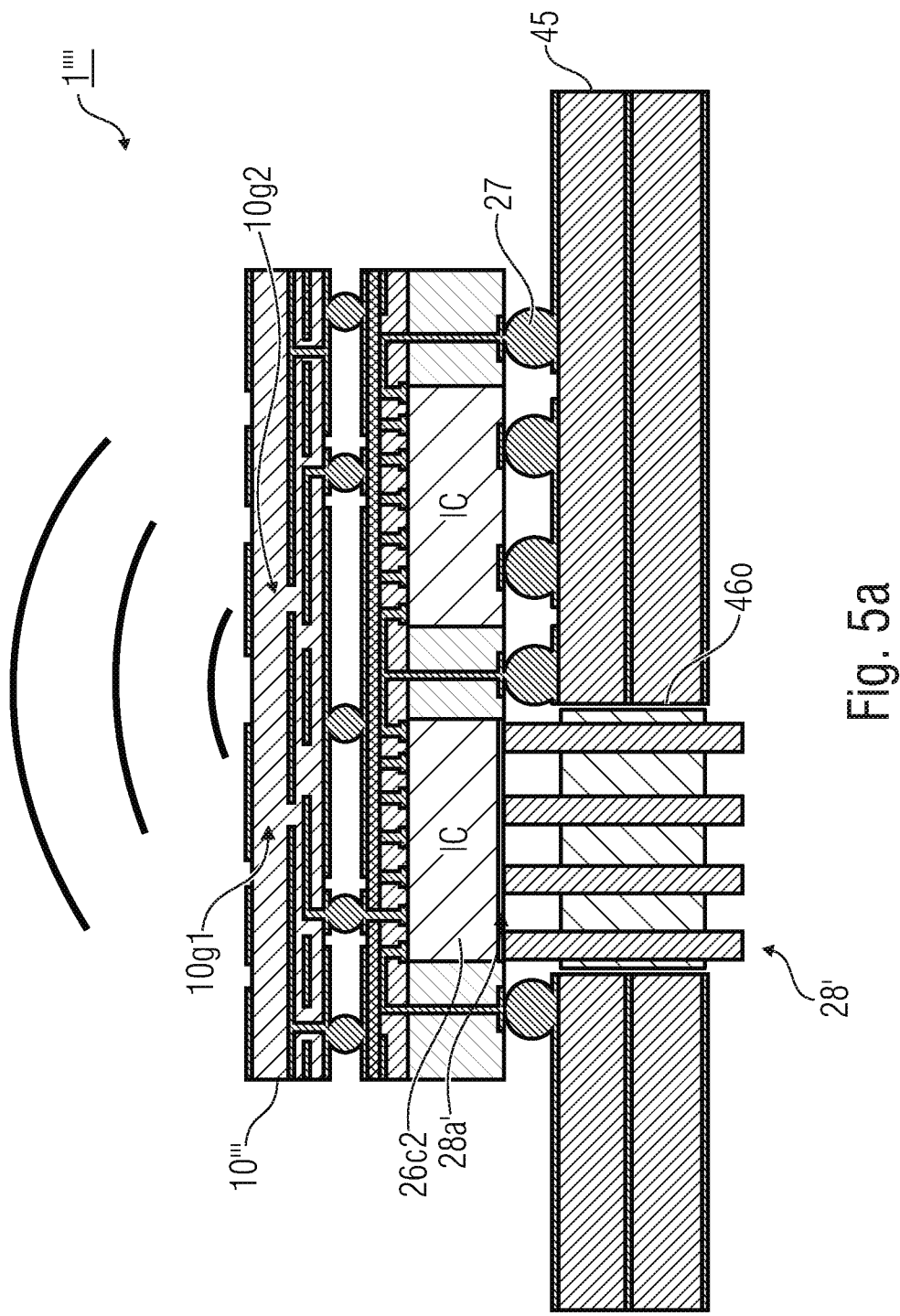
FIG. 5a-5c are schematic illustrations of applications of the wafer-level packaging based modules according to further embodiments.
Figure 5B:
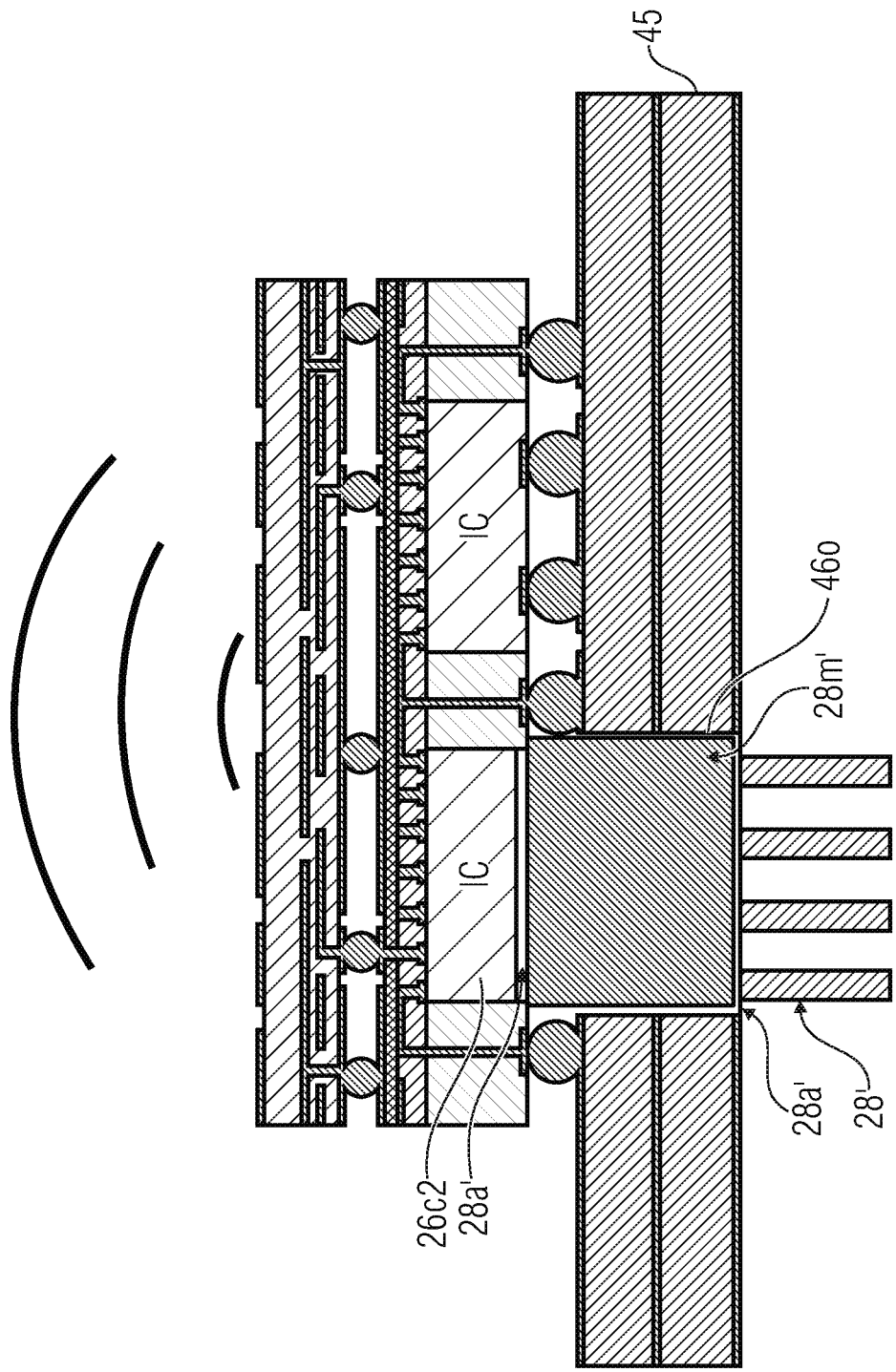

FIG. 5b shows an almost identical application to FIG. 5a, wherein here the heat sink 28' comprises an additional metal block 28m'. This metal block is provided in the area of the opening 46o and again connected to the chip 26c2 via mounting means 28'.

Here, it should be noted that the heat sink illustrated in FIGS. 5a and 5b cannot only extend across the area of a chip 26c2 but can also be dimensioned such that the same laterally touches several chips, i.e., the chips 26c1 and 26c2 at the same time. Alternatively, it would also be possible that each chip comprises its own heat sink.

Figure 5C:
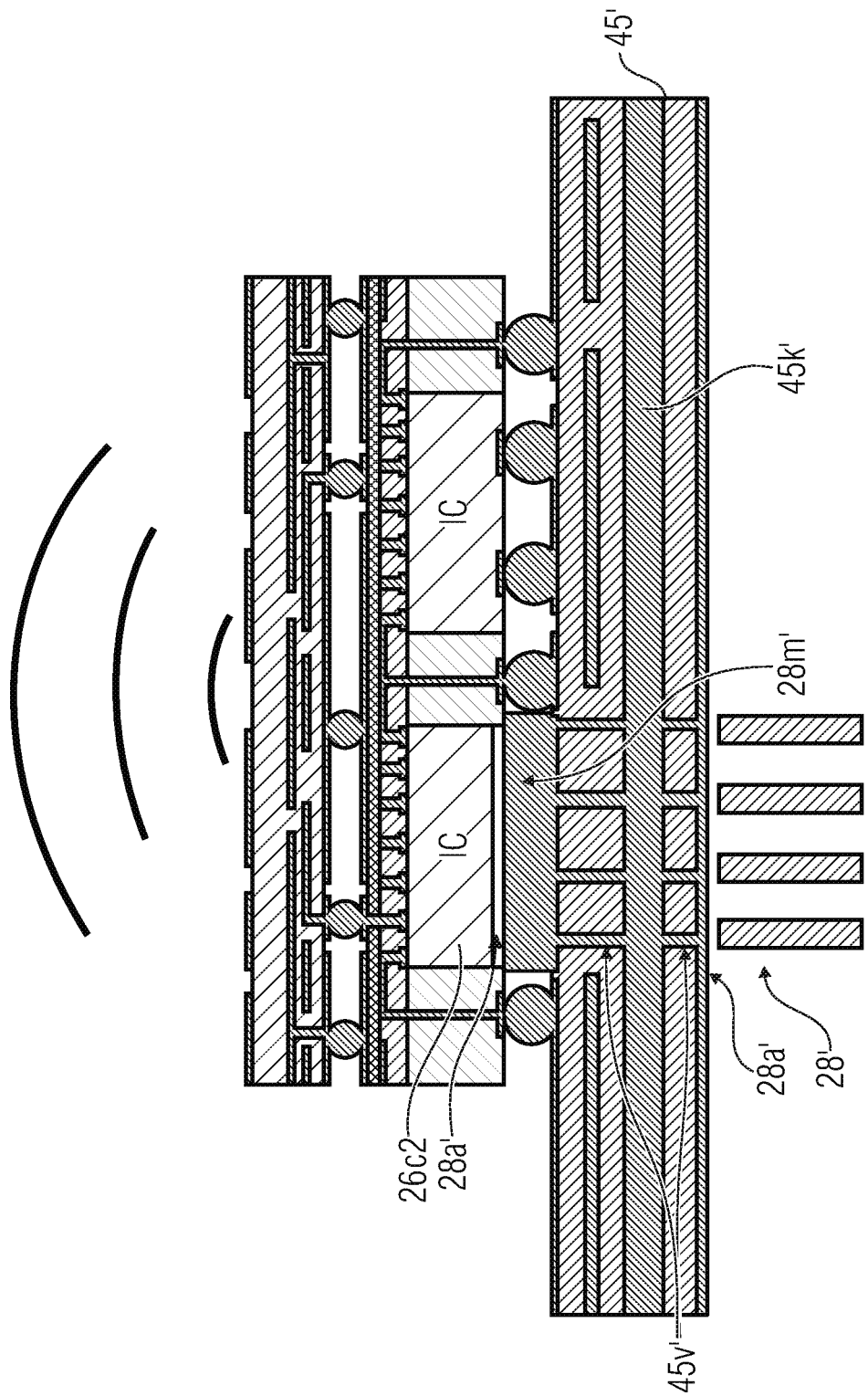

FIG. 5c shows a further variation of the application of the module 1'''' to a system board 45'. The same includes a distinct metal core 45k which comprises thermal vias 45v' in particular in the area of the chip 26c2. Between the board 45' in the area of the chip 26c, again a metal block 28m'' is provided, wherein a heat sink 28' is arranged on the opposite side of the system board 45'. This heat sink 28' can, for example, have the form of a hollow body. Both the metal block 28m'' and the heat sink 28' can be optionally connected to the individual areas by means of thermally conductive mounting means 28' in order to ensure good heat transfer.

Although the above embodiments have been discussed in particular in the context of module 1, 1', 1'', 1''', 1'''', 1''''' and 1'''''', it should be noted that the description of an apparatus feature can also be considered as a description of a respective method step/production step.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. Wafer-level packaging based module, comprising:
an antenna board comprising at least one antenna element introduced into an antenna layer and a shielding element introduced in an opposite shielding layer in the area of the at least one antenna element;
a chip board comprising a contacting layer, a rewiring layer opposite to the contacting layer, a shielding layer comprising at least one shielding element arranged on the rewiring layer and a chip layer comprising at least one chip lying between the contacting layer and the rewiring layer, wherein the chip layer comprises at least one via connecting the contacting layer to the rewiring layer;
wherein the chip board and/or the contacting layer comprises an opening for contacting contact elements or a cooling body in the lateral area of the chip on the side of the contacting layer;
wherein the antenna board is connected to the chip board by means of electrically conductive connecting elements on the side of the rewiring layer of the chip board.

2. Wafer-level packaging based module according to claim 1, wherein the antenna board comprises a via or a transmission channel that projects through the antenna board and the shielding layer of the antenna board and that is electrically coupled to the antenna element.

3. Wafer-level packaging based module according to claim 2, wherein the following elements are positioned in a laterally flush manner in the area of the chip and/or in the area of the antenna element:
the via or the transmission channel of the antenna board; and/or
the contact element or the transmission channel of the chip board; and/or
the connecting element.

4. Wafer-level packaging based module according to claim 1, wherein the chip board comprises a contact element or a transmission channel in the rewiring layer that projects through the shielding layer and that is electrically coupled to the chip.

5. Wafer-level packaging based module according to claim 4, wherein the antenna board comprises at least one via or one transmission channel that projects through the antenna board and the shielding layer and that is electrically coupled to the at least one antenna element; and
wherein the via or the transmission channel of the antenna board is connected to the transmission channel of the chip board by means of a connecting element or connecting channel.

6. Wafer-level packaging based module according to claim 5, wherein a vertical transmission line is configured by:
the via or the transmission channel of the antenna board; and
the connecting element or the connecting channel.

7. Wafer-level packaging based module according to claim 1, wherein at least one connecting element connects the following elements:
the shielding element or the shielding layer of the antenna board with
the shielding element or the shielding layer of the chip board.

8. Wafer-level packaging based module according to claim 1, wherein the connecting element comprises a solder ball and/or a BGA ball.

9. Wafer-level packaging based module according to claim 1, wherein the antenna board is connected to the chip board such that a cavity is formed between the shielding layer of the antenna board and the shielding layer of the chip board.

10. Wafer-level packaging based module according to claim 1, wherein the shielding element of the shielding layer of the antenna board is arranged in a laterally flush manner or at least overlapping with the antenna element of the shielding layer of the chip board.

11. Wafer-level packaging based module according to claim 1, wherein a cooling body is comprised in the lateral area of the opening.

12. Wafer-level packaging based module according to claim 1, wherein the contacting layer comprises one or several solder balls or BGA balls as contact elements or as cooling body in the lateral area of the opening.

13. Wafer-level packaging based module according to claim 1, wherein the at least one antenna element is configured to emit electromagnetic radiation via the surface facing away from the chip board and/or laterally with regard to the antenna board.

14. Wafer-level packaging based module according to claim 1, wherein the antenna board comprises a perforated substrate material in the area of the at least one antenna element.

15. Wafer-level packaging based module according to claim 1, wherein the shielding layer and the opposite shielding layer are arranged in parallel; and
wherein the opposite shielding layer and the shielding layer are electrically connected, or wherein the shielding element of the opposite shielding layer and the at least one shielding element of the shielding layer are electrically connected; and/or
wherein the shielding layer is arranged within the chip board such that the shielding layer is facing the opposite shielding layer of the antenna board.

\* \* \* \* \*